(12) United States Patent
Hull et al.

(10) Patent No.: US 11,584,101 B2
(45) Date of Patent: Feb. 21, 2023

(54) DENSIFICATION METHODS AND APPARATUSES

(71) Applicant: THE BOEING COMPANY, Chicago, IL (US)

(72) Inventors: John R. Hull, Sammamish, WA (US); Marc R. Matsen, Seattle, WA (US)

(73) Assignee: The Boeing Company, Chicago, IL (US)

( * ) Notice: Subject to any disclaimer, the term of this patent is extended or adjusted under 35 U.S.C. 154(b) by 428 days.

(21) Appl. No.: 16/719,357

(22) Filed: Dec. 18, 2019

(65) Prior Publication Data

US 2020/0130314 A1 Apr. 30, 2020

Related U.S. Application Data

(62) Division of application No. 15/431,413, filed on Feb. 13, 2017, now Pat. No. 10,549,497.

(51) Int. Cl.
*B22F 3/02* (2006.01)
*H05B 3/03* (2006.01)
(Continued)

(52) U.S. Cl.
CPC .............. *B30B 15/34* (2013.01); *B22F 3/003* (2013.01); *B22F 3/087* (2013.01); *B30B 11/00* (2013.01);
(Continued)

(58) Field of Classification Search
None
See application file for complete search history.

(56) References Cited

U.S. PATENT DOCUMENTS 5,169,572 A    12/1992   Matthews
6,001,304 A * 12/1999   Yoo ..................... C04B 35/6455
(Continued)

FOREIGN PATENT DOCUMENTS

CN       1268415 A    10/2000
CN   101044638 A     9/2007
(Continued)

OTHER PUBLICATIONS

State Intellectual Property Office of PRC; Second Office Action for Application No. 2047114167757 dated Nov. 11, 2021.
(Continued)

*Primary Examiner* — Joseph M. Pelham
(74) *Attorney, Agent, or Firm* — Parsons Behle & Latimer

(57) ABSTRACT

An apparatus includes a first electrode exhibiting a first Seebeck coefficient, a second electrode exhibiting a second Seebeck coefficient greater than the first Seebeck coefficient, and particles between the first and second electrodes exhibiting a third Seebeck coefficient between the first and second Seebeck coefficients. An alternating current power supply is electrically connected to the first and second electrodes. Heat is generated due to the Peltier effect at a junction between the first electrode and the particles and at a junction between the second electrode and the particles. Heat is removed due to the Peltier effect at the junction between the first electrode and the particles and at the junction between the second electrode and the particles. The particles are densified due to heating and cooling phase transitions between a higher-temperature solid phase and a lower-temperature solid phase while compressing the particles.

20 Claims, 3 Drawing Sheets

(51) Int. Cl.
*H05B 3/06* (2006.01)
*H05B 1/02* (2006.01)
*H01L 35/28* (2006.01)
*B30B 15/34* (2006.01)
*B22F 3/00* (2021.01)
*B22F 3/087* (2006.01)
*B30B 11/00* (2006.01)
*B22F 3/105* (2006.01)
*C22C 1/04* (2023.01)
*H05B 3/00* (2006.01)
*H05B 3/60* (2006.01)

(52) U.S. Cl.
CPC .............. *H01L 35/28* (2013.01); *H05B 3/03* (2013.01); *B22F 2003/1051* (2013.01); *B22F 2202/06* (2013.01); *B22F 2999/00* (2013.01); *C22C 1/0458* (2013.01); *H05B 3/0004* (2013.01); *H05B 3/0023* (2013.01); *H05B 3/60* (2013.01)

(56) References Cited

U.S. PATENT DOCUMENTS

| | | | | |
|---|---|---|---|---|
| 2002/0063365 | A1* | 5/2002 | Vigliotti | B82Y 30/00 264/618 |
| 2009/0218551 | A1* | 9/2009 | Sengupta | H01L 35/34 252/519.4 |
| 2011/0052485 | A1 | 3/2011 | Seo et al. | |
| 2011/0297203 | A1* | 12/2011 | Salvador | H01L 35/32 136/239 |
| 2013/0085055 | A1* | 4/2013 | Raj | B23K 9/00 219/137 R |
| 2013/0126800 | A1* | 5/2013 | Backhaus-Ricoult | C04B 35/645 252/519.12 |
| 2015/0101325 | A1 | 4/2015 | Beblo et al. | |
| 2018/0072001 | A1* | 3/2018 | Swartz | B29C 67/08 |
| 2018/0304362 | A1* | 10/2018 | Paulus | B22F 7/06 |
| 2019/0001427 | A1* | 1/2019 | Shuck | H01F 41/0253 |
| 2019/0070818 | A1 | 3/2019 | Bram et al. | |
| 2020/0070416 | A1* | 3/2020 | Sweeney | B29C 64/118 |

FOREIGN PATENT DOCUMENTS

| | | |
|---|---|---|
| CN | 101521260 A | 9/2009 |
| CN | 101755312 A | 6/2010 |
| CN | 106048437 A | 7/2016 |
| JP | 2008274439 A | 11/2008 |
| JP | 2011528995 A | 12/2011 |
| JP | 2012104560 A | 5/2012 |
| JP | 2015098645 A | 5/2015 |
| JP | 2015518650 A | 7/2015 |
| JP | 2016511793 A | 4/2016 |
| WO | WO1997043120 A1 | 11/1997 |

OTHER PUBLICATIONS

Chinese Patent Office; First Office Action for Application No. 2047114167757 dated Apr. 25, 2021.

Japanese Patent Office; Office Action for Application No. 2018-021646 dated Feb. 1, 2022.

Lasance, Clemens J.M., The Seebeck Coefficient, Design, No. 4, Technical Data, Test & Measurement, vol. 12, Nov. 1, 2006.

H.W. Worner, Thermoelectric Properties of Titanium with Special Reference to the Allotropic Transformation, Austral. J. Sci. Res., vol. 4(1), pp. 62-83, 1951.

H. Carreon, Detection of Fretting Damage in Aerospace Materials by Thermoelectric Means, Proc. SPIE 8694, 6 pp. (2013)). 2013.

European Patent Office; Extended European Search Report for Application No. 17204952.0 dated Jun. 7, 2018.

Orru R et al: "Consolidation/synthesis of materials by electric current activated/assisted sintering", Material Science and Engineering: R: Reports, Elsevier, Amsterdam, NL, vol. 63, No. 4-6, Feb. 12, 2009. pp. 127-287, XP025914673, ISSN:0927-796X, DOI: 10.1016/J.MSER.2008.09.003 Feb. 12, 2009.

C. Schuh et al: "Enhanced densification of metal powders by transformation-mismatch plasticity", ACTA Materialia., vol. 48, No. 8, May 1, 2000, pp. 1639-1653, XP055479277, GB May 1, 2000.

Federal Service for Intellectual Property Russian Patent Office; Office Action; Russian Patent Application No. 2017139548 dated Apr. 23, 2019.

Federal Service for Intellectual Property Russian Patent Office; Office Action issued in Russian Application No. 2017139548 dated Dec. 21, 2018.

I.L.Rogelberg, V.M. Beilin, Alloys for thermocouples, reference book, M., Metallurgy, 1983, 181 pages.

V.V.Tolmachev et al. Thermodynamics and electrodynamics of a continuous medium, MGU, 1988, 232 pp. 1988.

U.S. Patent and Trademark Office; Office Action for U.S. Appl. No. 15/431,413 dated Jun. 25, 2019 Jun. 25, 2019.

* cited by examiner

DENSIFICATION METHODS AND APPARATUSES

RELATED APPLICATIONS

This application is a divisional patent application of U.S. patent application Ser. No. 15/431,413 filed on Feb. 13, 2017 and entitled "Densification Methods and Apparatuses," the disclosure of which is hereby incorporated by reference in its entirety.
Densification Methods and Apparatuses

BACKGROUND

Superplastic forming is an industrial process for creating precise and complex forms out of metallic materials. Some solid, crystalline materials, such as some metals and alloys, exhibit superplasticity and may be deformed beyond expected limits of plastic deformation. Often, the behavior depends on a fine-grained microstructure. The major advantage of this process is that it can form large and complex parts in one operation. The finished product has excellent precision and a fine surface finish. It also does not suffer from spring-back or residual stresses. The biggest disadvantage is its slow forming rate. Completion times vary from two minutes to two hours; therefore, it is usually used on lower-volume products. Accordingly, it will be appreciated that superplastic forming methods and apparatuses that decrease forming rate would be beneficial.

SUMMARY

A method includes placing electrically conductive particles between and in contact with a first electrode and a second electrode. The particles provide a conductive path between the first electrode and the second electrode. The first electrode exhibits a first Seebeck coefficient, the second electrode exhibits a second Seebeck coefficient greater than the first Seebeck coefficient, and the particles exhibit a third Seebeck coefficient between the first and the second Seebeck coefficient.

The method includes compressing the particles while heating the particles to a higher temperature above a temperature for a heating phase transition from a lower-temperature solid phase to a higher-temperature solid phase. The heating includes applying an electric current from the second electrode through the particles to the first electrode and thus generating heat due to the Peltier effect at a junction between the first electrode and the particles and at a junction between the second electrode and the particles. As a result of the heating, the particles phase transition from the lower-temperature solid phase to the higher-temperature solid phase.

After the heating phase transition of the particles, the particles are compressed while cooling the particles to a lower temperature below a temperature for a cooling phase transition from the higher-temperature solid phase to the lower-temperature solid phase. The cooling includes applying an electric current from the first electrode through the particles to the second electrode and thus removing heat due to the Peltier effect at the junction between the first electrode and the particles and at the junction between the second electrode and the particles. As a result of the cooling, the particles phase transition from the higher-temperature solid phase to the lower-temperature solid phase. The method includes densifying the particles due to the heating and cooling phase transitions while compressing the particles.

Another method includes placing electrically conductive particles containing primarily titanium between and in contact with a first electrode and a second electrode. The particles provide a conductive path between the first electrode and the second electrode. The first electrode exhibits a first Seebeck coefficient. The second electrode exhibits a second Seebeck coefficient greater than the first Seebeck coefficient by 5 µV/K or greater at a temperature for a phase transition of the particles between an alpha phase and a beta phase. The particles exhibit a third Seebeck coefficient different by at least 20% from the first and second Seebeck coefficients at the temperature for the phase transition of the particles between an alpha phase and a beta phase.

The method includes compressing the particles at less than 7 ksi (kilopound/inch$^2$) while heating the particles to a higher temperature 1-10% above the phase transition temperature. The heating includes applying an electric current from the second electrode through the particles to the first electrode and thus generating heat due to the Peltier effect at a junction between the first electrode and the particles and at a junction between the second electrode and the particles. As a result of the heating, the particles phase transition from the alpha phase to the beta phase.

After the heating phase transition of the particles, the method includes compressing the particles at less than 7 ksi while cooling the particles to a lower temperature 1-10% below the phase transition temperature. The cooling includes applying the electric current from the first electrode through the particles to the second electrode and thus removing heat due to the Peltier effect at the junction between the first electrode and the particles and at the junction between the second electrode and the particles. As a result of the cooling, the particles phase transition from the beta phase to the alpha phase. The method includes repeatedly cycling the heating phase transition and the cooling phase transition and thereby superplastically forming the particles into a unitary part due to the heating and cooling phase transitions while compressing the particles.

An apparatus includes a first electrode exhibiting a first Seebeck coefficient and a second electrode exhibiting a second Seebeck coefficient greater than the first Seebeck coefficient. A die cavity between the first electrode and the second electrode allows electrically conductive particles, when placed therein, to contact the first electrode and the second electrode and provide a conductive path between the first and second electrodes. An alternating current power supply is electrically connected to the first electrode and to the second electrode.

The power supply is configured to allow selectively changing a direction of current flow to apply an electric current from the second electrode through the particles to the first electrode or to apply the electric current from the first electrode through the particles to the second electrode. The power supply is also configured to allow producing a sufficient current frequency and a sufficient current amount to generate Peltier effect heating and Peltier effect cooling, depending on the direction of current flow, at a junction between the first electrode and the particles and at a junction between the second electrode and the particles. Sufficiency of the current frequency depends on a distance between the first and second electrodes through the particles. The apparatus includes a compaction press configured to allow sufficient compression of the particles when the alternating electric current is applied to densify the particles due to heating and cooling phase transitions while compressing the particles.

The features, functions, and advantages that have been discussed can be achieved independently in various embodiments or may be combined in yet other embodiments further details of which can be seen with reference to the following description and drawings.

BRIEF DESCRIPTION OF THE DRAWINGS

Some embodiments are described below with reference to the following accompanying drawings.

DETAILED DESCRIPTION

Figure 1:
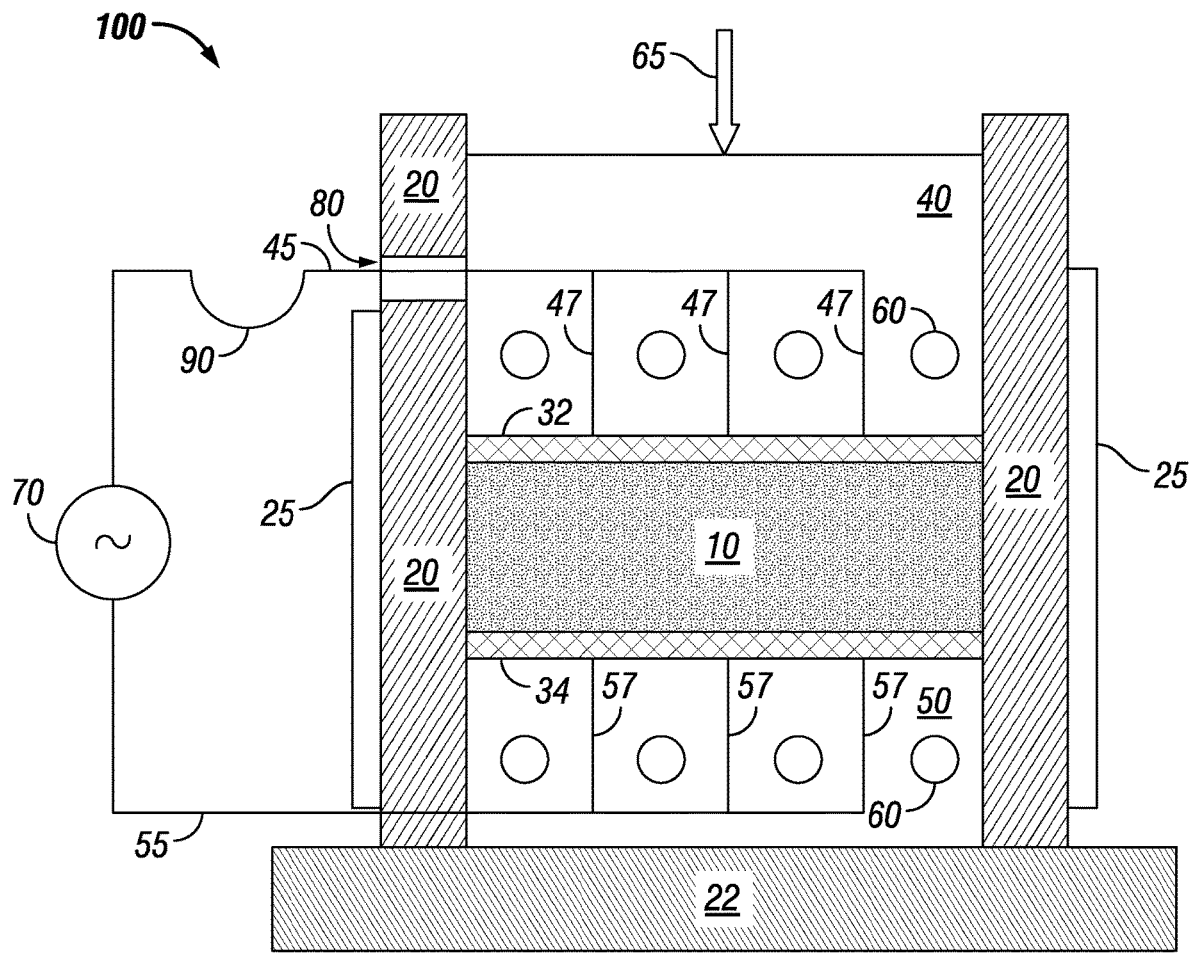
FIG. 1 is a cross-sectional view of a densification apparatus.

The superplastic forming technique can be used for the densification of crystalline, metallic powders. Well-known powder metallurgy techniques also densify metal powders, but rely on different physical properties and process conditions. In superplastic forming, crystalline, metal powders cycled around their solid phase transformation produce internal stresses and superplastic-like behavior develops. Since the greatest disadvantage of superplastic forming is its slow forming rate (completion times vary from two minutes to two hours), powder densification can be time-consuming when using many cycles for the part to achieve sufficient densification.

Pressure applied in powder densification forces the powder to fill in voids. Usually, the phase diagram of a metal shows the transition temperature of a phase transition boundary varying with the pressure. Thus, pressure cycling provides one method to obtain the cyclical transition between solid phases. However, most metals necessitate impractically large pressure variations since they show a small temperature variation with pressure.

Temperature cycling presents another employable method with the applied temperature raised or lowered at the boundaries of a part. The time it takes for the temperature change to thermally diffuse from the boundary of the part to the center partially governs the cycle time. A phase change in the part lengthens cycle time. During the phase change, the temperature remains constant, and no temperature gradient exists across the portion of the thickness still undergoing the phase change. With no temperature gradient, no movement of heat occurs, so the process can be lengthy and a large part thickness exacerbates the process length.

The heating step (alpha to beta transition) can be shortened by passing electric current through the part and using the Joule heat in the powder to drive the phase transition. Even at uniform temperature, the phase change can be rather uniform across the part. However, no analogous method exists for the cooling step of the cycle.

Consequently, the methods and apparatuses disclosed herein use an electrode with a Seebeck coefficient significantly different from that of the metallic powder at the phase transition temperature. For example, with titanium powder, a molybdenum or tungsten electrode could be used. By means of the Peltier effect, this difference in the Seebeck coefficient produces a heat flux at the junction between the electrode and the powder when electric current flows at the junction. The junction heat flux provides a faster phase transition for the material at the junction than could be obtained by Joule heating or cooling by known thermal conduction.

Conductive particles, such as titanium powder, can thus be densified to near-net shape parts using superplastic forming by cycling through the alpha-beta phase transition. Under temperature and pressure, the powder contained between electrodes yields a Peltier-effect heat flux from the junction of the electrodes and the powder. The Peltier heat flux may be supplemented with Joule heating from an electric current. The Peltier effect provides a heat flux at the part boundary that compensates for thermal conduction losses, making the phase transition more uniform across the part thickness. Also, the Peltier effect produces a sharp temperature gradient at the boundary during the cooling step of the cycle, thus, speeding the transition to the lower-temperature alpha phase.

In spark plasma sintering (SPS), a high temperature quickly causes phase change in a material. The portions of the material that are closest to the electrodes change phase first, before they conductively transfer heat to adjacent material. This results in an "outside first, then the middle" method of consolidating a material. It also uses high heat. For titanium, SPS often operates in the range of 900-1400° C.

In comparison, the method and apparatuses herein rely on the Seebeck coefficient (also known as thermopower, thermoelectric power, and thermoelectric sensitivity) of a material. The Seebeck coefficient is a measure of the magnitude of an induced thermoelectric voltage in response to a temperature difference across that material, as induced by the Seebeck effect. In general, Seebeck coefficients are temperature dependent (see FIG. 4), though some depend less on temperature within certain temperature ranges. Significantly, methods and apparatuses disclosed herein define the temperatures at which desired Seebeck coefficients are selected.

While similarities exist between the methods and apparatuses disclosed herein and SPS (e.g., current flows through the material to be densified), differences exist as well. SPS works to increase densification by causing the particles to sinter, which means that the material to be processed must be raised to a temperature at which material from one particle leaves that particle and deposits on an adjacent particle. Often, larger particles gain material at the expense of smaller particles. SPS generally uses higher temperature than superplastic forming. Superplastic densification works by changing the shape of the particles to fit together. An advantage exists in starting with particles of known size that do not change size significantly in the final product.

Sintering temperature for titanium is in the range 900-1400° C., often 1260° C. The lower end of the temperature range does not produce as high a final density in SPS, so higher temperatures are usually used. The temperature for transition between alpha and beta phases of titanium is 883° C. Energy savings and processing advantages exist at a lower temperature in the methods and apparatuses disclosed herein, resulting in lower cost and better products.

Avoiding the higher temperatures needed for sintering reduces crystal grain growth, when grains congeal and average grain size increases, and allows less severe tooling requirements. Also, methods and apparatuses disclosed herein increase the speed of consolidation at lower pressures by the stimulation of superplastic forming through the phase change phenomenon. Furthermore, stimulating superplastic forming behavior through phase change dimensional differences allows the material flow and even pressure sufficient for consolidation of particles in more complex components. This also enables a component that is nearer the final product dimensions.

The methods and apparatuses disclosed herein allow advantageous use of the Peltier effect by engineering with the intent of relying on the Peltier effect. Incidental occurrence of the Peltier effect in other methods would offer little or no effective benefit. For example, using alternating electric current herein allows the temperature change to sweep though the part and, when done around the phase change temperature, to produce the phase changes resulting in superplastic forming properties. In comparison, SPS uses direct current pulses, which do not produce a sweeping thermal wave and therefore do not yield superplastic forming properties. Instead, direct current pulses produce a static difference in temperature from one side of the part to the other.

Accordingly, one method includes placing electrically conductive particles between and in contact with a first electrode and a second electrode. The particles provide a conductive path between the first electrode and the second electrode. The first electrode exhibits a first Seebeck coefficient, the second electrode exhibits a second Seebeck coefficient greater than the first Seebeck coefficient, and the particles exhibit a third Seebeck coefficient between the first and the second Seebeck coefficient.

The method includes compressing the particles while heating the particles to a higher temperature above a temperature for a heating phase transition from a lower-temperature solid phase to a higher-temperature solid phase. The heating includes applying an electric current from the second electrode through the particles to the first electrode and thus generating heat due to the Peltier effect at a junction between the first electrode and the particles and at a junction between the second electrode and the particles. As a result of the heating, the particles phase transition from the lower-temperature solid phase to the higher-temperature solid phase.

After the heating phase transition of the particles, the particles are compressed while cooling the particles to a lower temperature below a temperature for a cooling phase transition from the higher-temperature solid phase to the lower-temperature solid phase. The cooling includes applying an electric current from the first electrode through the particles to the second electrode and thus removing heat due to the Peltier effect at the junction between the first electrode and the particles and at the junction between the second electrode and the particles. As a result of the cooling, the particles phase transition from the higher-temperature solid phase to the lower-temperature solid phase. The method includes densifying the particles due to the heating and cooling phase transitions while compressing the particles.

By way of example, the second Seebeck coefficient may be greater than the first Seebeck coefficient by 5 microvolts/Kelvin ($\mu$V/K) or greater at the temperatures for the heating and cooling phase transitions. The third Seebeck coefficient may be different by at least 20% from the first and second Seebeck coefficients at the temperatures for the heating and cooling phase transitions. Heat generated by the Peltier effect increases with increasing differences between the Seebeck coefficients. The second electrode may consist of or consist essentially of molybdenum or tungsten at the junction between the second electrode and the particles. The first electrode may consist of or consist essentially of palladium, graphite, or constant (55% copper-45% nickel alloy) at the junction between the first electrode and the particles.

Figure 4:
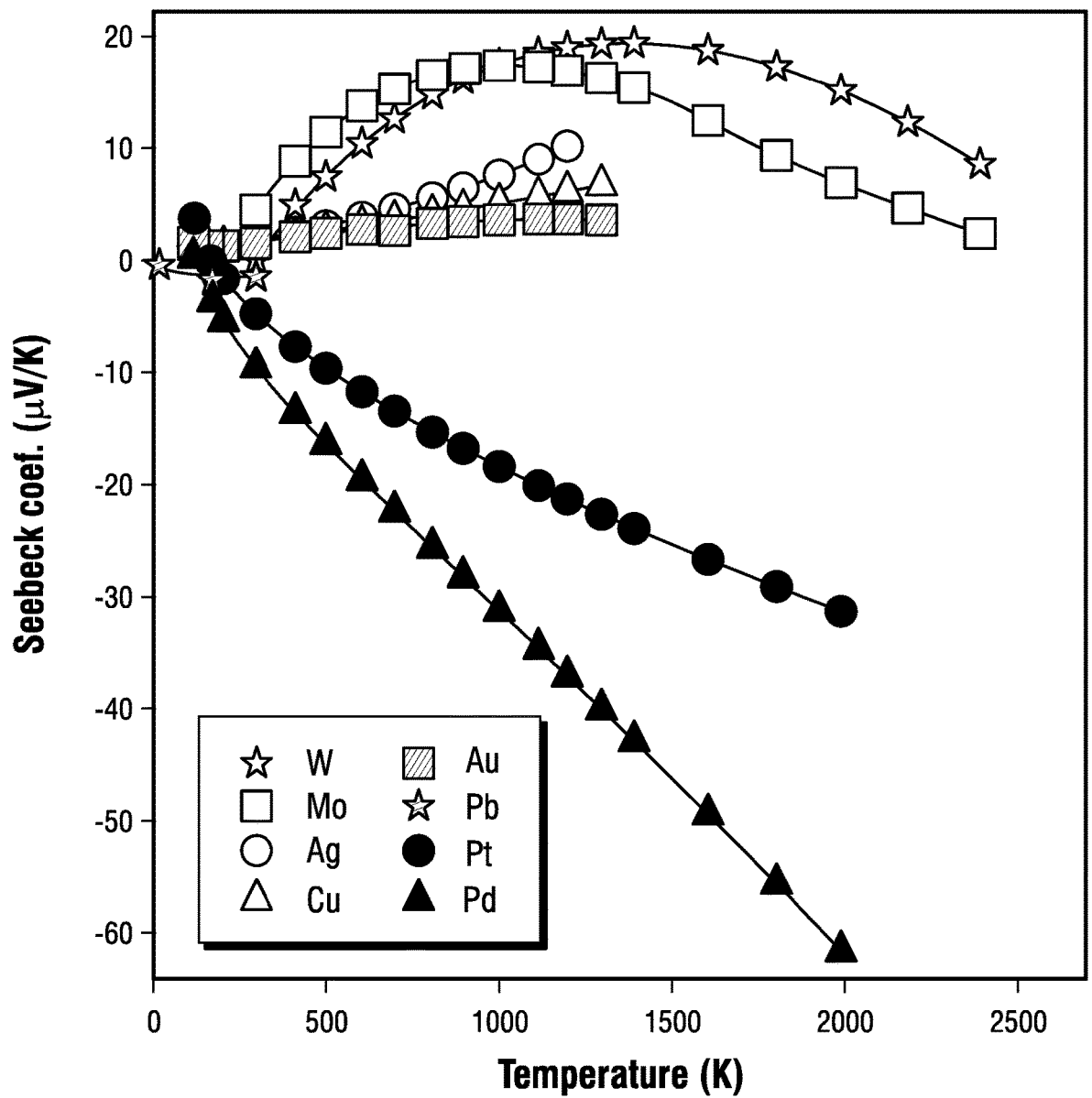
FIG. 4 is a chart of absolute Seebeck coefficients showing their temperature dependence. (Cusack, N.; Kendall, P. (1958). "The Absolute Scale of Thermoelectric Power at High Temperature". Proceedings of the Physical Society. 72 (5): 898. Data for Pb from Christian, J. W.; Jan, J.-P.; Pearson, W. B.; Templeton, I. M. (1958). "Thermo-Electricity at Low Temperatures. VI. A Redetermination of the Absolute Scale of Thermo-Electric Power of Lead". Proceedings of the Royal Society A: Mathematical, Physical and Engineering Sciences. 245 (1241): 213.)

FIG. 4 shows how the Seebeck coefficient of molybdenum and tungsten varies with temperature in comparison to the Seebeck coefficient of palladium. A large difference exists over a wide range of temperature, including at the temperature for transition between alpha and beta phases of titanium at 883° C. (1156 K). FIG. 4 does not show the graphite or constant Seebeck coefficients, but the literature reports graphite exhibiting a coefficient similar to platinum, which FIG. 4 shows, and constant exhibiting a coefficient of −35 $\mu$V/K relative to platinum.

The particles may be crystalline and contain a microstructure including one or more crystalline grains. Since the methods and apparatuses disclosed herein use multiple phase transitions to impart superplasticity to the particles, grain size does not significantly influence the process. The substantial independence from grain size constitutes a benefit in comparison to other methods. In an isothermal approach, such as sintering, including spark plasma sintering, grain size affects superplasticity with smaller grains enhancing superplasticity, since multiple phase transitions are not utilized.

The particles may contain primarily titanium, that is, greater than 50 weight % (wt %) titanium. Consequently, commercially pure titanium or titanium alloys, such as, Ti-6Al-4V (titanium alloy with 6 wt % aluminum and 4 wt % vanadium), may be used, as well as other metals and metal alloys exhibiting properties consistent with the disclosure herein. Commercially pure titanium has a titanium content of 99.67 wt % or greater. The literature reports that titanium exhibits a Seebeck coefficient of about 12 to 22 $\mu$V/K relative to platinum over a temperature range of 0 to 1,000° C. (H. W. Worner, Thermoelectric Properties of Titanium with Special Reference to the Allotropic Transformation, Austral. J. Sci. Res., Vol. 4(1), pp. 62-83 (1951).) The literature reports that Ti-6Al-4V exhibits a Seebeck coefficient of −5 $\mu$V/K at 2° C. (H. Carreon, Detection of Fretting Damage in Aerospace Materials by Thermoelectric Means, Proc. SPIE 8694, 6 pp. (2013)).

The lower-temperature solid phase may be the alpha phase and the higher-temperature solid phase may be the beta phase. For Ti-6Al-4V, the temperature may oscillate between 860 and 1,020° C. For commercially pure Ti, the temperature may oscillate between 863 and 903° C. Particle size does not significantly influence the process since the particles rapidly form into the interstices between particles. In comparison, sintering uses very slow process to move the metal such that particle size is very important.

Densifying the particles under compression in the described manner advantageously allows substantially maintaining grain sizes from the original particles. Therefore, particles may be prepared under known techniques to exhibit grain sizes desired in a finished product and then consolidated using the methods herein. A net or near-net shape part may then be obtained with little or no concern for post-densification processing to yield desired grain sizes, since the initial grain size survives densification.

Pressures on the order of 1 to 10 ksi (kilopound/inch$^2$) are relevant to the methods and apparatuses disclosed herein. A suitable pressure depends on a variety of factors, including the grain size exhibited by the particles, the number of heating/cooling cycles, the duration of heating/cooling cycles, and the degree of densification desired. Larger grains use higher pressure to achieve an equivalent densification.

Also, fewer cycles and/or shorter cycles use higher pressure to achieve an equivalent densification. Generally, higher densification uses higher pressure for a given grain size. Even so, the methods and apparatuses disclosed herein achieve higher densification with less pressure compared to SPS. Accordingly, compressing the particles while heating the particles and compressing the particles while cooling the particles may both include compressing the particles at less than 7 ksi, such as 3 ksi or less, including 1-3 ksi, or 2-3 ksi, while reaching 95% or greater densification.

Heating the particles may additionally include conductive thermal transfer to the particles by a means other than the Peltier effect. Although less effective, cooling the particles could additionally include conductive thermal transfer from the particles by a means other than the Peltier effect. Known techniques for thermal transfer may be used. The description of FIG. 1 provides examples of other heating and cooling means.

The temperature for the heating phase transition and the temperature for the cooling phase transition are usually the same, but may be different, depending on the phase transition properties of a specific material comprised by the particles. Heating the particles may include heating the particles to 1-10% above the phase transition temperature. Cooling the particles may include cooling the particles to 1-10% below the phase transition temperature. The temperature ranges are expected to be sufficient to phase transition greater than 95% of the total volume of particles, such as 100%, in each half of the heating/cooling cycle.

The electric current applied from the second electrode through the particles to the first electrode and the electric current applied from the first electrode through the particles to the second electrode may be an alternating electric current. The alternating electric current may be supplied at a frequency matched to a distance between the electrodes. Current may be 1-15 amp/mm$^2$ at the junction between the first electrode and the particles and at the junction between the second electrode and the particles.

The particles may be contained by a total volume of an unfinished part. Phase transitioning the particles from the lower-temperature solid phase to the higher-temperature solid phase may include phase transitioning greater than 95% of the total volume, such as 100%. Phase transitioning the particles from the higher-temperature solid phase to the lower-temperature solid phase may include phase transitioning greater than 95% of the total volume. A greater volume of phase transitioned particles tends to increase the rate of densification. Densifying the particles may include repeatedly cycling the heating phase transition and the cooling phase transition and thereby superplastically forming the particles into a unitary part due to the heating and cooling phase transitions while compressing the particles.

Cycling the heating phase transition and the cooling phase transition may be repeated greater than 10 times, such as 15 to 30 times. The other process parameters described herein are expected to enable the described range for the number of cycles to yield 95% or greater densification. For example, processing at 3 ksi or less for 15-30 cycles and yielding 95% or greater densification represents a notable increase in process efficiency for producing titanium parts.

Another method, with further details, includes placing electrically conductive particles containing primarily titanium between and in contact with a first electrode and a second electrode. The particles provide a conductive path between the first electrode and the second electrode. The first electrode exhibits a first Seebeck coefficient. The second electrode exhibits a second Seebeck coefficient greater than the first Seebeck coefficient by 5 μV/K or greater at a temperature for a phase transition of the particles between an alpha phase and a beta phase. The particles exhibit a third Seebeck coefficient different by at least 20% from the first and second Seebeck coefficients at the temperature for the phase transition of the particles between an alpha phase and a beta phase.

The method includes compressing the particles at less than 7 ksi while heating the particles to a higher temperature 1-10% above the phase transition temperature. The heating includes applying an electric current from the second electrode through the particles to the first electrode and thus generating heat due to the Peltier effect at a junction between the first electrode and the particles and at a junction between the second electrode and the particles. As a result of the heating, the particles phase transition from the alpha phase to the beta phase.

After the heating phase transition of the particles, the method includes compressing the particles at less than 7 ksi while cooling the particles to a lower temperature 1-10% below the phase transition temperature. The cooling includes applying the electric current from the first electrode through the particles to the second electrode and thus removing heat due to the Peltier effect at the junction between the first electrode and the particles and at the junction between the second electrode and the particles. As a result of the cooling, the particles phase transition from the beta phase to the alpha phase. The method includes repeatedly cycling the heating phase transition and the cooling phase transition and thereby superplastically forming the particles into a unitary part due to the heating and cooling phase transitions while compressing the particles.

By way of example, the heating may additionally include conductive thermal transfer to the particles by a means other than the Peltier effect. The electric current may be an alternating electric current supplied at a frequency matched to a distance between the electrodes and at 1-15 amp/mm$^2$ at the junction between the first electrode and the particles and at the junction between the second electrode and the particles. When the particles are contained by a total volume of an unfinished part, the phase transitioning of the particles from the alpha phase to the beta phase may include phase transitioning greater than 95% of the total volume. The phase transitioning of the particles from the beta phase to the alpha phase may also include phase transitioning greater than 95% of the total volume. Cycling the heating phase transition and the cooling phase transition may be repeated 15-30 times.

FIG. 1 shows an example of an apparatus for densification of conductive particles, such as crystalline, metallic powder by carrying out the methods described herein. Features of the apparatus and its method of operation may be incorporated into other methods and apparatuses disclosed herein. Apparatus 100 is arranged to provide densification of metallic powder 10. Powder 10 is contained between sidewalls 20, upper electrode 32, and lower electrode 34. The apparatus rests on baseplate 22. Lower electrode 34 is directly on top of thermal block 50 over baseplate 22. Directly above upper electrode 32 is thermal block 40. Thermal block 40 also serves as a push piston and receives pressure 65 on its upper surface. Thermal blocks 40 and 50 are heated by thermal elements 60, which may be electrical resistance heaters or passages that contain hot flowing gas or liquid. Conceivably, though less effective, cold flowing gas or liquid could be used in the passages to cool thermal blocks 40 and 50.

Alternating current is fed to electrodes 32, 34 from power supply 70 by connecting wires 45 and 55. Power supply 70 may be an AC power supply with a frequency matched to a distance between electrodes 32, 34. Power supply 70 may have a variable frequency with a sufficient range to match the distance between electrodes or be designed to exhibit a set, desired frequency. Power supply 70 could instead include a DC power supply coupled with a polarity switch, such as a bipolar amplifier, so that current direction could be selectively reversed, creating an alternating current. In order to distribute current to electrodes 32, 34 more uniformly, connecting wires 45, 55 may be divided into parallel strands 47 and 57. To accommodate the vertical movement of piston 40, connecting wire 45 may have flexible portion 90 that feeds through a slot 80 in one of sidewalls 20. Sidewalls 20 are heated by elements 25. Thermal elements 60 in push piston 40 may also have flexible connections to their source of heat, cooling, or electrical power.

The electrode material has an electrical conductivity sufficient to carry a sufficient current for the process without heating significantly more than the metal powder. At the same time, the electrode material is mechanically strong enough to transmit a sufficient densification pressure to the metal powder without undergoing mechanical damage. Electrodes 32, 34 are shown parallel, which increases uniformity of temperature distribution during heating and cooling, but they could be non-parallel.

FIG. 1 shows upper electrode 32 contacting all of an upper surface of powder 10 and lower electrode 34 contacting all of a lower surface of powder 10. Electrodes 32, 34 contacting all of the upper and lower surfaces of powder 10 increases uniformity of heat distribution during Peltier heating or cooling. Even so, it is conceivable that electrodes could instead be segmented and distributed across the upper and/or lower surfaces of powder 10. Doing so could reduce the amount of material used for electrodes, such as for large parts to be processed. Uniformity of heat distribution might decrease such that increased processing time would be warranted, but the cost of increased processing time compared to savings in electrode cost could be balanced.

For the purposes of the present document, superplastic formation occurs by cycling powder 10 above and below a phase transition temperature, while powder 10 is under a compressive load. In the example of commercially pure titanium, the phase transition is between the alpha and beta phases and occurs at approximately 883° C. The phase transition temperature is often a weak function of pressure. The purpose of enacting the phase change is to provide a change of shape for the individual grains, whereby they might slip past each other under pressure during the phase change toward a denser formation.

The process for apparatus 100 begins with thermal elements 25 and 60 bringing the system up to a temperature just below the phase transition temperature, for example, 1-10% below. Pressure 65 is then applied. Then power supply 70 is turned on so that current flows in a circuit and between electrodes 32 and 34 through metal powder 10. The current flow heats the bulk of metal powder 10 by Joule heating, wherein the volumetric heating is proportional to the square of the current density.

Figure 2:
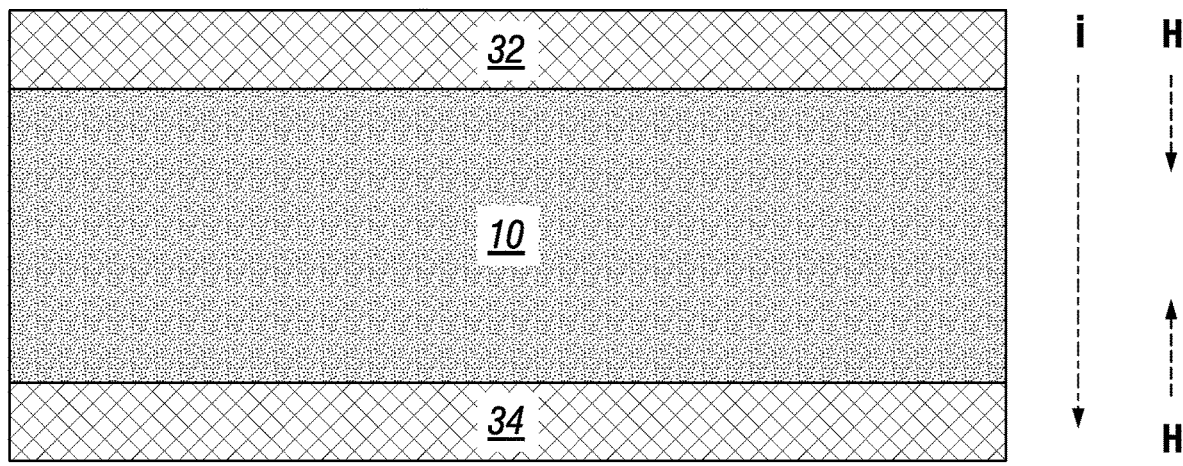
FIGS. 2 and 3 are diagrams of current and heat flow in part of the apparatus of FIG. 1.
Figure 3:
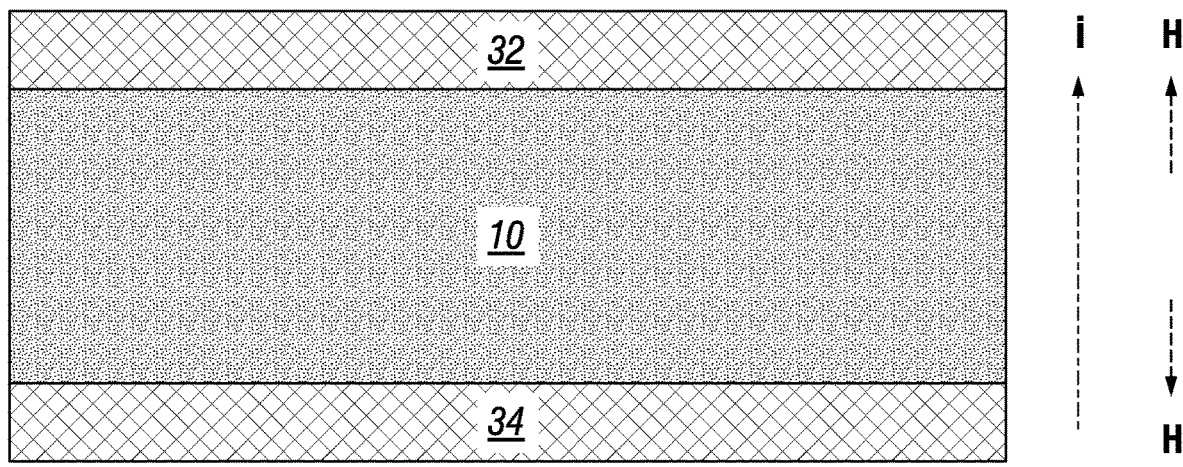

Apparatus 100 is configured so that a significant change in the Seebeck coefficient exists at the junctions of electrodes 32, 34 and metal powder 10. As shown in FIGS. 2 and 3, metal powder 10 exhibits a greater Seebeck coefficient ($S_{10}$) than electrode 34 ($S_{34}$) and, in turn, electrode 32 exhibits a greater Seebeck coefficient ($S_{32}$) than metal powder 10 ($S_{10}$). By means of the Peltier effect, the coefficient differences produce a heat flux at the junctions between electrodes 32, 34 and metal powder 10. For current "i" in a downward direction, FIG. 2 shows generating heat "H" at the junctions. For current "i" in an upward current direction, FIG. 3 shows removing heat "H" at the junctions.

The current could be alternated by changing direction periodically, that is, at regular intervals of time for both polarities. One would observe in a sine wave that the signal gradually reaches positive and negative peaks at ¼ and ¾ of the period. In the methods and apparatuses disclosed herein, a benefit exists in using a different wave form in which current is applied more uniformly over the first and second halves of the period, such as in a square wave. In that manner, duration of the heating and cooling portions of the cycle may be reduced by using all or substantially all of a selected current during each half of the period.

Selecting the frequency of the alternating current is a function of the distance between the electrodes, in other words, the thickness of the part being formed. A greater distance between the electrodes (a thicker part) warrants a longer period to obtain an equivalent degree of phase transition due to more volume and mass. Accordingly, a benefit exists in directing the current between electrodes through a thinnest dimension of a part to reduce cycle time.

A cycle time (which determines frequency) may be selected sufficient to phase transition greater than 95%, such as 100%, of the total volume from the lower-temperature solid phase to the higher-temperature solid phase during heating and to phase transition greater than 95%, such as 100%, of the total volume from the higher-temperature solid phase to the lower-temperature solid phase during cooling. Suitable cycle times depend on the part size and composition. For the expected applications of the methods and apparatuses disclosed herein, a cycle time of about 30 seconds (e.g., for small, commercially pure Ti parts) to 120 minutes (e.g., for large, complex, Ti-6Al-4V parts) would provide a significant cycle time decrease compared to known methods. Consequently, for a part of the same size and composition densified to the same degree, the methods and apparatuses disclosed herein enable reducing overall densification time compared to processes that do not include Peltier effect heat generation and removal using the particles themselves.

Based on the disclosures herein, it is apparent that parameters may be selected so that the alternating current cycle time is periodic. However, the alternating current could be aperiodic in a circumstance where the time for heating and the time for cooling are selected to be different. Different times could be warranted, for example, if the rise above the transition temperature is different in degree than the drop below the transition temperature. Also, depending on the heating and cooling techniques selected, a cooling step could take longer than a heating step (or vice versa) even when the temperature rise and drop are equal. One possible example, discussed in more detail below, includes overcoming Joule heating while applying electric current to produce a cooling Peltier effect.

To understand how the Joule heating and Peltier effect enable the phase transition cycling to speed up, first consider how a system would work that relied just on heating and cooling from the thermal blocks. Start with everything at the phase transition temperature and with the metal powder in the lower-temperature phase. The process continues with the thermal blocks brought to some temperature above the phase transition temperature. The heating takes time because of the sensible heat capacity of the thermal blocks. Once the temperature of the thermal block is above that of the metal powder, heat then flows into the metal powder by thermal conduction.

Initially, the temperature of the metal powder stays the same with all of the heat used to change the phase of the metal powder at the junction of the powder and thermal block. No temperature gradient exists across the thickness of the powder, so no heat flows to the powder interior. Indeed, once the phase change occurs at the junction, the temperature increases significantly above the phase change temperature to get heat to flow to the next sub-layer in from the junction. Thus, one effectively brings the temperature of the entire metal powder to a temperature significantly above the phase transition temperature in order to enact a phase change across the entire powder layer. To cycle the phase back to the lower-temperature phase, one lowers the temperature of the thermal blocks. Then the same phenomenon happens in reverse.

With Joule heating of the metal powder, the powder heats uniformly, and the phase change happens effectively at the same time throughout the powder layer. In addition, the metal powder need not reach a temperature that is significantly higher than the transition temperature. When cooling to transition to the lower-temperature phase, the advantage is less clear, because with electric current flowing in the metal powder, the tendency is to heat. However, the Peltier effect at one of the boundaries starts to remove heat immediately, without the need to lower the temperature of the thermal blocks.

The temperature of the thermal blocks may be kept at some value below the transition temperature and Joule heating and Peltier cooling and heating may be used to increase the cycling rate. In such case, Peltier heating at both junctions helps the metal powder to overcome the low temperature at those junctions. Also, Peltier cooling at both junctions helps return the metal powder to the low temperature at those junctions. The temperatures of the thermal blocks could be cycled up and down to assist in the process. However, in general, the time to cycle temperature of the thermal blocks is likely to be longer than that of the Joule heating and Peltier effect.

Accordingly, one apparatus includes a first electrode exhibiting a first Seebeck coefficient and a second electrode exhibiting a second Seebeck coefficient greater than the first Seebeck coefficient. A die cavity between the first electrode and the second electrode allows electrically conductive particles, when placed therein, to contact the first electrode and the second electrode and provide a conductive path between the first and second electrodes. An alternating current power supply is electrically connected to the first electrode and to the second electrode.

The power supply is configured to allow selectively changing a direction of current flow to apply an electric current from the second electrode through the particles to the first electrode or to apply the electric current from the first electrode through the particles to the second electrode. The power supply is also configured to allow producing a sufficient current frequency and a sufficient current amount to generate Peltier effect heating and Peltier effect cooling, depending on the direction of current flow, at a junction between the first electrode and the particles and at a junction between the second electrode and the particles. Sufficiency of the current frequency depends on a distance between the first and second electrodes through the particles. The apparatus includes a compaction press configured to allow sufficient compression of the particles when the alternating electric current is applied to densify the particles due to heating and cooling phase transitions while compressing the particles.

By way of example, the second Seebeck coefficient may be greater than the first Seebeck coefficient by 5 µV/K or greater when measured at 20° C. The first electrode may consist of or consist essentially of molybdenum or tungsten at the junction between the first electrode and the particles. The second electrode may consist of or consist essentially of palladium, graphite, or constant at the junction between the second electrode and the particles. The entire first electrode may consist of molybdenum or tungsten and/or the entire second electrode may consist of palladium, graphite, or constant. The sufficient current frequency may be matched to a distance between the electrodes. The sufficient current may be 1-15 amp/mm$^2$ at the junction between the first electrode and the particles and at the junction between the second electrode and the particles. The sufficient compression may be less than 7 ksi as applied by the first and/or second electrode on the particles.

The inventors expressly contemplate that the various options described herein for individual methods and devices are not intended to be so limited except where incompatible. The features and benefits of individual methods herein may also be used in combination with devices and other methods discussed herein even though not specifically indicated elsewhere. Similarly, the features and benefits of individual devices herein may also be used in combination with methods and other devices discussed herein even though not specifically indicated elsewhere.

In compliance with the statute, the embodiments have been described in language more or less specific as to structural and methodical features. It is to be understood, however, that the embodiments are not limited to the specific features shown and described. The embodiments are, therefore, claimed in any of their forms or modifications within the proper scope of the appended claims appropriately interpreted in accordance with the doctrine of equivalents.

What is claimed is:

1. An apparatus comprising:
    a first electrode exhibiting a first Seebeck coefficient and a second electrode exhibiting a second Seebeck coefficient greater than the first Seebeck coefficient;
    a die cavity between the first electrode and the second electrode such that electrically conductive particles, when placed therein, contact the first electrode and the second electrode and provide a conductive path between the first and second electrodes;
    an alternating current power supply electrically connected to the first electrode and to the second electrode, the power supply having a variable frequency;
    the power supply being configured to apply an electric current from the second electrode through the particles to the first electrode or to apply the electric current from the first electrode through the particles to the second electrode;
    the power supply being configured to allow producing a sufficient current frequency and a sufficient current amount to generate Peltier effect heating and Peltier effect cooling, depending on the direction of current flow, at a junction between the first electrode and the particles and at a junction between the second electrode and the particles, the sufficiency of the current frequency depending on a distance between the first and second electrodes through the particles, wherein the sufficient current comprises 1-15 amp/mm$^2$ at the junction between the first electrode and the particles and at the junction between the second electrode and the particles; and a compaction press configured to allow sufficient compression of the particles when the alternating electric current is applied to densify the particles due to heating and cooling phase transitions while compressing the particles.

2. The apparatus of claim 1, wherein the second Seebeck coefficient is greater than the first Seebeck coefficient by 5 µV/K or greater when measured at 20° C.

3. The apparatus of claim 1, wherein the first electrode consists essentially of molybdenum or tungsten at the junction between the first electrode and the particles and/or the second electrode consists essentially of palladium, graphite, or constantan at the junction between the second electrode and the particles.

4. The apparatus of claim 1, wherein the sufficient current frequency is matched to a distance between the electrodes and, wherein the sufficient compression comprises less than 7 ksi as applied by the first and/or second electrode on the particles.

5. The apparatus of claim 1, wherein the first electrode is parallel to the second electrode.

6. The apparatus of claim 1, further comprising a first side wall and a second side wall, wherein the die cavity is formed between the first side wall, the first electrode, the second side wall, and the second electrode.

7. The apparatus of claim 6, wherein the alternating current power supply is electrically connected to the first electrode and to the second electrode via connecting wires, wherein a portion of the connecting wires passes through a slot in the first side wall.

8. The apparatus of claim 7, wherein the portion of the connecting wires that passes through the slot is a flexible portion of wire.

9. The apparatus of claim 1, further comprising a first thermal block positioned adjacent to the first electrode, wherein the first thermal block is heated by a thermal element.

10. The apparatus of claim 9, further comprising a second thermal block positioned adjacent to the second electrode, wherein the second thermal bock is heated by a thermal element.

11. The apparatus of claim 1, wherein the particles contain greater than 50 weight % titanium.

12. An apparatus comprising:
a first electrode exhibiting a first Seebeck coefficient and a second electrode exhibiting a second Seebeck coefficient greater than the first Seebeck coefficient;
a die cavity between the first electrode and the second electrode such that electrically conductive particles, when placed therein, contact the first electrode and the second electrode and provide a conductive path between the first and second electrodes;
an power supply electrically connected to the first electrode and to the second electrode, wherein the power supply is a direct current (DC) power supply;
the power supply being configured to allow selectively changing a direction of current flow to apply an electric current from the second electrode through the particles to the first electrode or to apply the electric current from the first electrode through the particles to the second electrode;
the power supply being configured to allow producing a sufficient current frequency and a sufficient current amount to generate Peltier effect heating and Peltier effect cooling, depending on the direction of current flow, at a junction between the first electrode and the particles and at a junction between the second electrode and the particles, the sufficiency of the current frequency depending on a distance between the first and second electrodes through the particles, wherein the sufficient current comprises 1-15 amp/mm$^2$ at the junction between the first electrode and the particles and at the junction between the second electrode and the particles; and
a compaction press configured to allow sufficient compression of the particles when the alternating electric current is applied to densify the particles due to heating and cooling phase transitions while compressing the particles.

13. The apparatus of claim 12, wherein the DC power supply is coupled to with polarity switch to allow selectively change the direction of current flow.

14. The apparatus of claim 13, wherein the polarity switch is a bipolar amplifier.

15. The apparatus of claim 12, wherein the second Seebeck coefficient is greater than the first Seebeck coefficient by 5 µV/K or greater when measured at 20° C.

16. The apparatus of claim 12, wherein the first electrode consists essentially of molybdenum or tungsten at the junction between the first electrode and the particles and/or the second electrode consists essentially of palladium, graphite, or constantan at the junction between the second electrode and the particles.

17. The apparatus of claim 12, wherein the sufficient current frequency is matched to a distance between the electrodes.

18. The apparatus of claim 12, wherein the sufficient compression comprises less than 7 ksi as applied by the first and/or second electrode on the particles.

19. The apparatus of claim 12, wherein the particles contain greater than 50 weight % titanium.

20. The apparatus of claim 12, further comprising a first thermal block positioned adjacent to the first electrode, wherein the first thermal block is heated by a first thermal element and a second thermal block positioned adjacent to the second electrode, wherein the second thermal block is heated by a second thermal element.

* * * * *